(12) United States Patent  (10) Patent No.: US 7,993,952 B2
Matsuyama  (45) Date of Patent: Aug. 9, 2011

(54) CHARGE TRANSFER DEVICE

(75) Inventor: Eiji Matsuyama, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/772,666

(22) Filed: May 3, 2010

(65) Prior Publication Data

US 2010/0210044 A1   Aug. 19, 2010

Related U.S. Application Data

(63) Continuation of application No. 12/058,939, filed on Mar. 31, 2008, now abandoned.

(30) Foreign Application Priority Data

Mar. 30, 2007   (JP) ................. 2007-091330

(51) Int. Cl.
  H01L 21/00 (2006.01)
  H01L 21/261 (2006.01)
  H01L 21/339 (2006.01)

(52) U.S. Cl. .......... 438/60; 438/144; 438/147; 438/512; 257/E21.457; 257/E21.617

(58) Field of Classification Search .......... 438/144, 438/147, 512; 257/E21.457, E21.617
See application file for complete search history.

(56) References Cited

U.S. PATENT DOCUMENTS

| 4,133,099 | A | * | 1/1979 | Hagiwara | 438/147 |
| 4,322,753 | A | | 3/1982 | Ishihara | |
| 4,590,506 | A | * | 5/1986 | Esser | 257/216 |
| 5,210,433 | A | * | 5/1993 | Ohsawa et al. | 257/250 |
| 5,402,459 | A | * | 3/1995 | Hynecek | 377/58 |
| 5,428,231 | A | | 6/1995 | Tanaka et al. | |
| 5,514,887 | A | * | 5/1996 | Hokari | 257/222 |
| 6,828,601 | B2 | * | 12/2004 | Shinohara | 257/183.1 |
| 7,244,971 | B2 | | 7/2007 | Sakamoto et al. | |
| 7,259,394 | B2 | * | 8/2007 | Tachikawa | 257/59 |
| 7,378,691 | B2 | * | 5/2008 | Geshi et al. | 257/223 |
| 2006/0157756 | A1 | * | 7/2006 | Tanaka et al. | 257/291 |

FOREIGN PATENT DOCUMENTS

| JP | 2001-196572 | 7/2001 |
| JP | 2001-308313 | 11/2001 |
| JP | 2004-022624 | 1/2004 |
| JP | 2005-209879 | 8/2005 |

* cited by examiner

Primary Examiner — Walter L Lindsay, Jr.
Assistant Examiner — Ron Pompey
(74) Attorney, Agent, or Firm — Young & Thompson

(57) ABSTRACT

A charge transfer device 1 has an P-type region, an N-type well provided to the surficial portion of the P-type region, and transfer electrodes having P-type conductivity, provided over the N-type substrate while placing an insulating film in between.

8 Claims, 19 Drawing Sheets

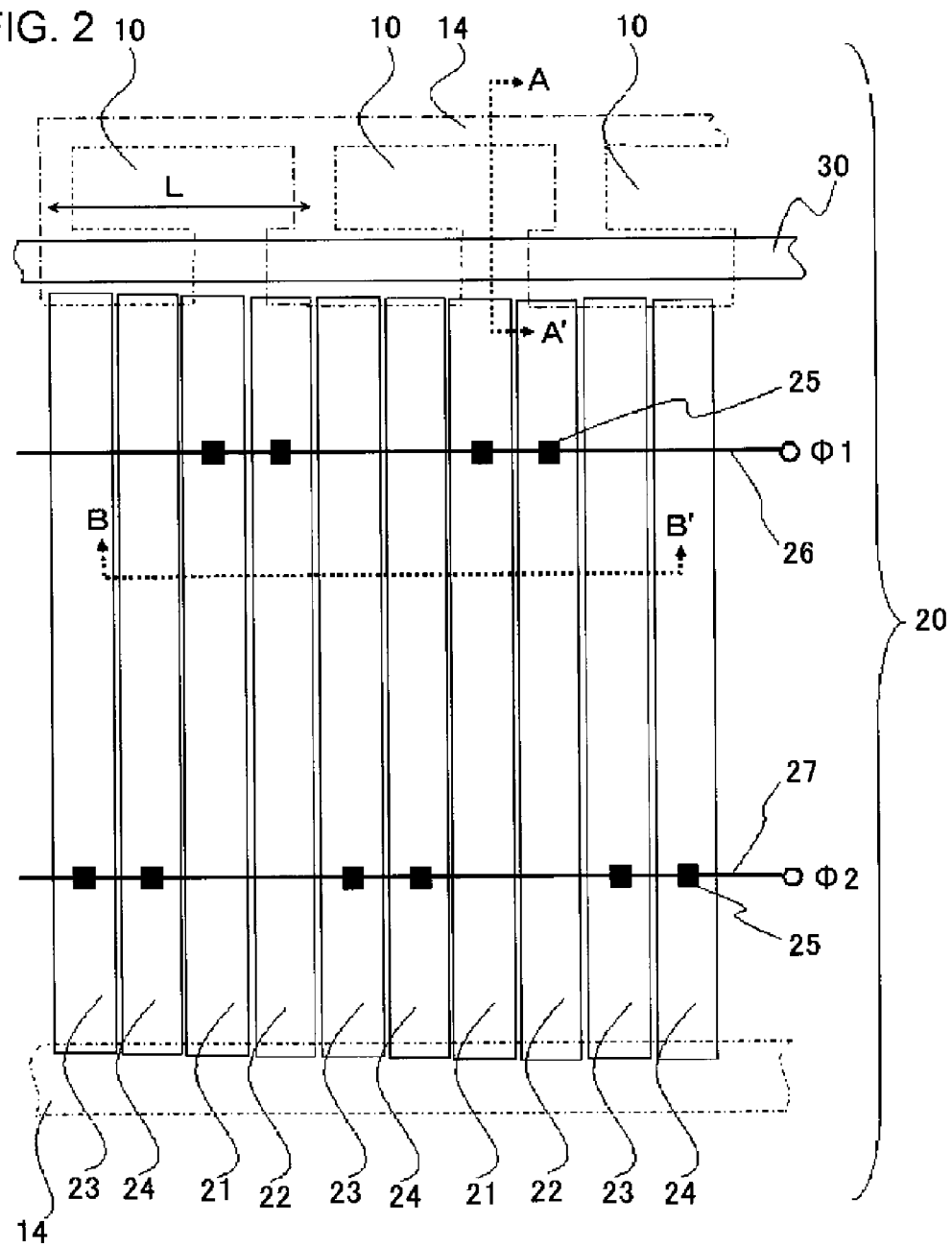

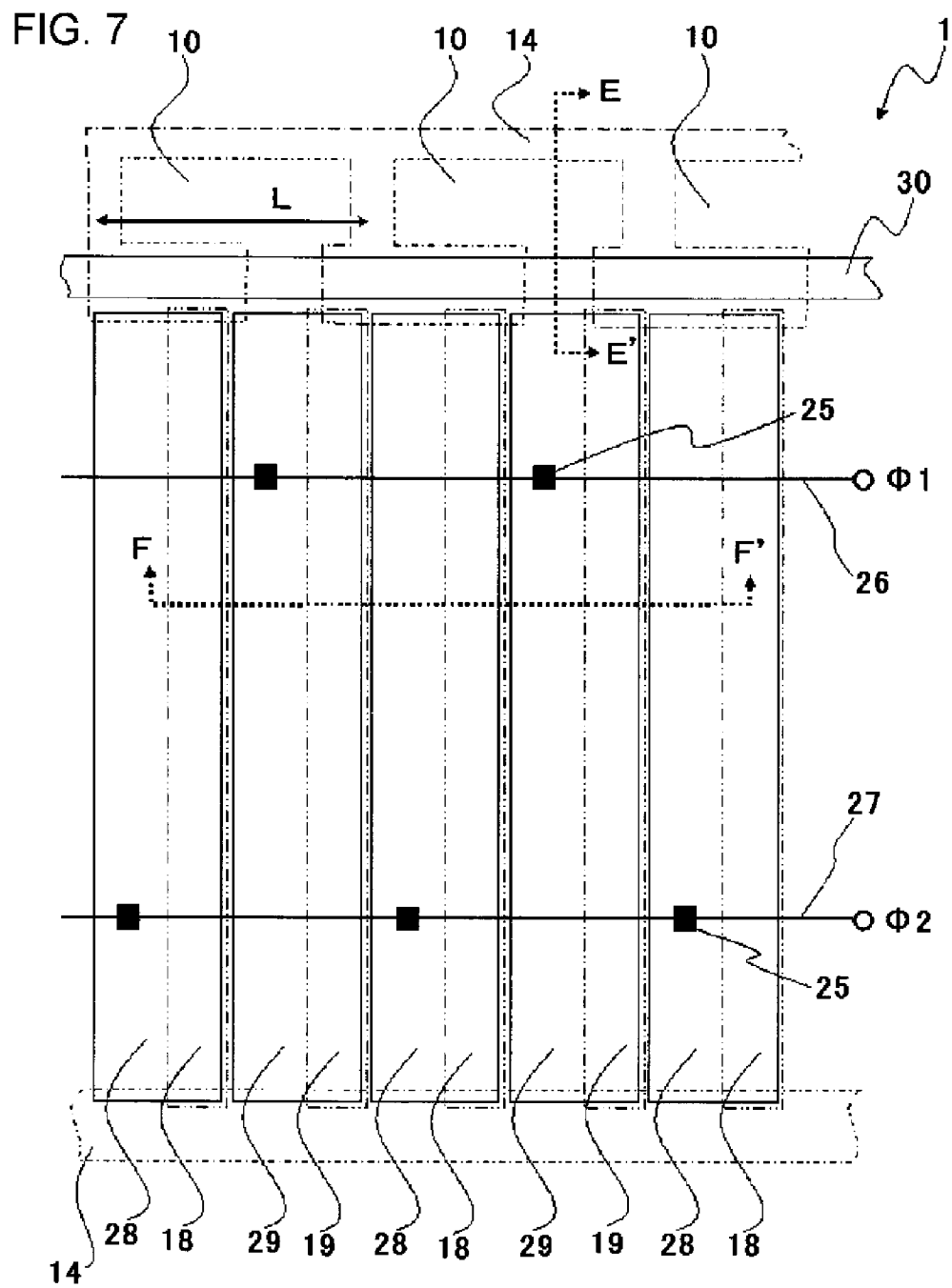

FIG. 9A
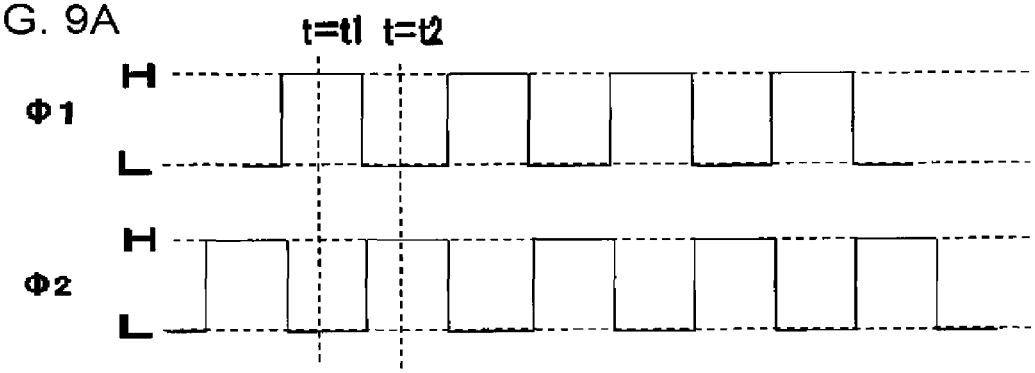
FIG. 9B
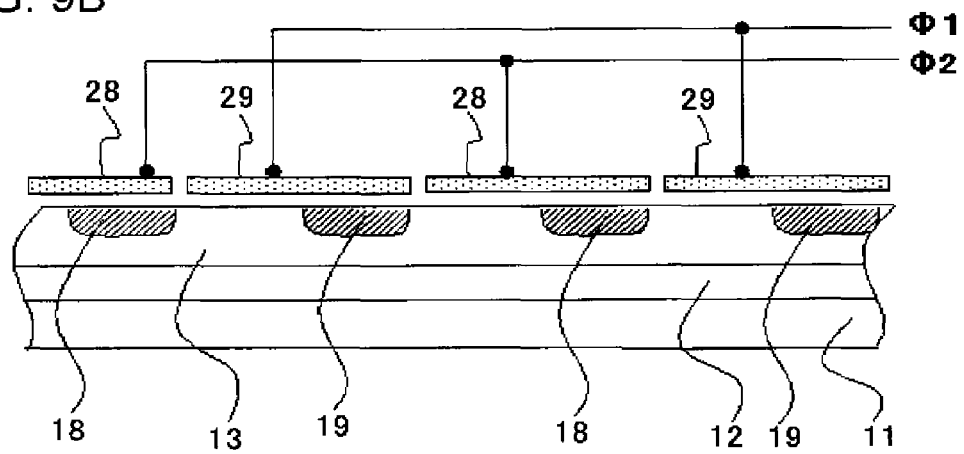
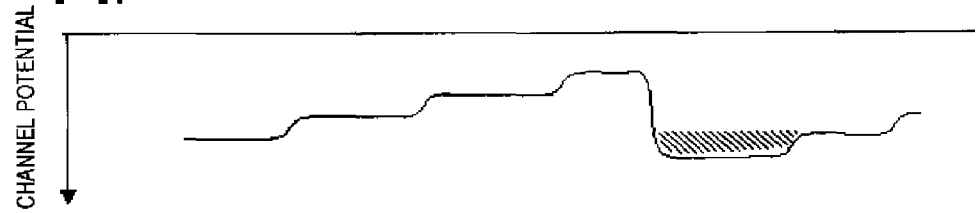
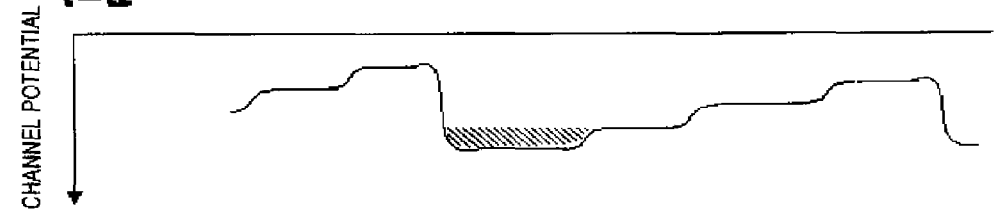

FIG. 14A
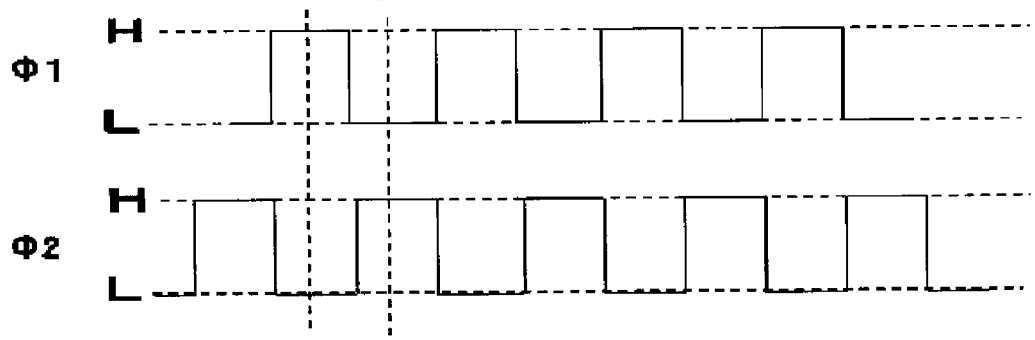
FIG. 14B
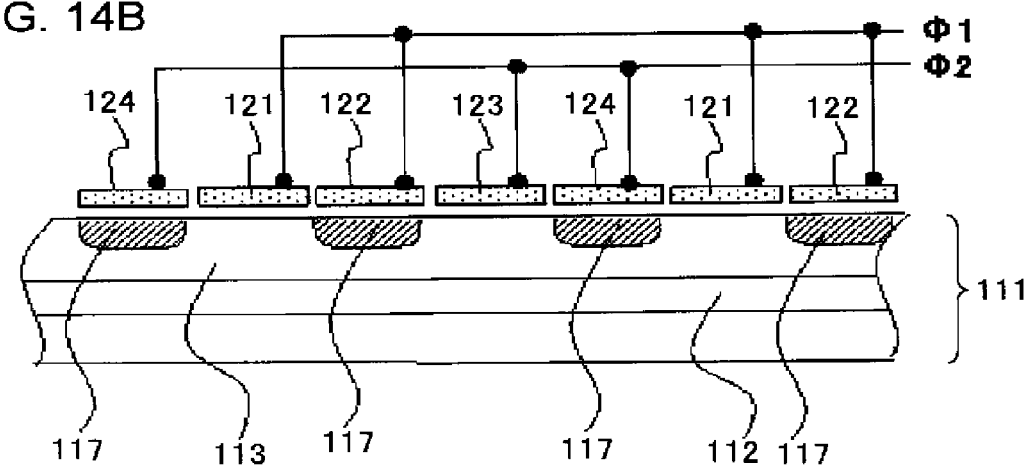
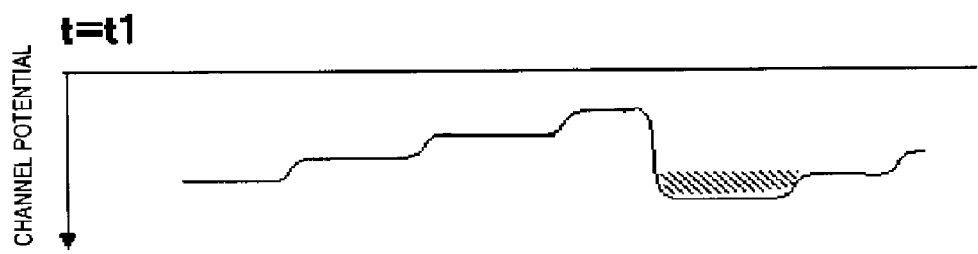
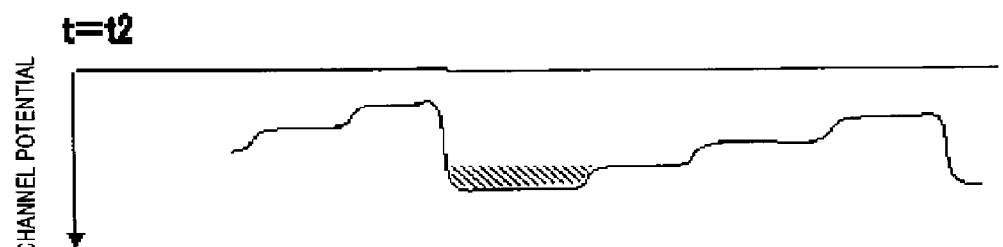

CHARGE TRANSFER DEVICE

This application is based on Japanese patent application No. 2007-091330 the content of which is incorporated hereinto by reference.

BACKGROUND

1. Technical Field

The present invention relates to a charge transfer device.

2. Related Art

FIG. 10 is a schematic drawing showing a linear CCD (charge coupled device) image sensor of related art. A CCD image sensor 101 has photodiodes 110, a CCD register 120, and a transfer gate electrode 130. On one end of the CCD register 120, there are provided a charge detecting unit 40 and an output circuit 50. The transfer gate electrode 130 is provided between the photodiodes 110 and the COD register 120.

FIG. 11 is a plan view showing a region in the vicinity of the photodiodes, the transfer gate electrode and the CCD register in the CCD image sensor 101. The photodiodes 110 are isolated from each other by a device isolation region 114 formed of a $P^+$-type diffusion layer.

The CCD register 120 contains four types of electrodes 121 to 124. The electrodes 121 are $\Phi 1$ storage electrodes formed of N-type polysilicon. The electrodes 122 are $\Phi 1$ barrier electrodes. The electrodes 123 are $\Phi 2$ storage electrodes formed of N-type polysilicon. The electrodes 124 are $\Phi 2$ barrier electrodes. These electrodes 121 to 124 are repetitively arranged in this order. The electrodes 121 to 124 are connected via contacts 125 to metal interconnects 126, 127, and are supplied with drive pulses $\Phi 1$ or $\Phi 2$. Assuming now pitch of unit cell in the direction of electron transfer as L, the configuration herein is such as making four electrodes 121 to 124 corresponded to L.

FIG. 13A and FIG. 13B are sectional views respectively taken along line H-H' and line I-I' in FIG. 11. In the surficial portion of a silicon substrate 111, there is a P-type well 112 formed on an N-type silicon substrate, and there is an N-type well 113 formed further in the surficial portion thereof. In the surficial portion of the P-type well 112, there are also a $P^+$-type diffusion layer 114' forming the device isolation region, an N-type diffusion layer 115 and a $P^+$-type diffusion layer 116 forming the photodiodes 110, and $N^-$-type diffusion layers 117, formed therein.

FIG. 14A and FIG. 14B are a timing chart of drive pulses shown in FIG. 11 and potential diagrams, respectively. By applying drive pulses $\Phi 1$ and $\Phi 2$, differed in the phase by 180° from each other, respectively to terminals $\Phi 1$, $\Phi 2$, potential at the portions under the individual electrodes varies, and electrons are serially transferred leftward in the drawing.

Similar technical art is disclosed in Japanese Laid-Open Patent Publication No. 2001-308313. Other technical arts are disclosed in Japanese Laid-Open Patent Publication Nos. 2004-22624, 2001-196572, and 2005-209879.

By the way, in order to realize lower power consumption of CCD image sensor, the present inventor has recognized that it is effective to lower the potential of the CCD section, and to lower NW (N well) concentration. However, lower NW concentration makes surface interference more likely to occur, raises a need of adjusting the potential of portions under the barrier electrode at a deeper level, and consequently results in a problem of reduction in maximum charge storage capacity of CCD.

FIG. 12 is a plan view of an output section 102 of a CCD image sensor 101. FIG. 13C is a sectional view taken along line J-J' in FIG. 12. FIG. 18A is a timing chart of drive pulses, and FIG. 18B is a sectional view of the output section of the CCD register and a potential diagram. The signal charges transferred from the CCD register 120 are output to the floating diffusion layer 146 while placing output gate electrode 140 in between. The MOS transistor 143 and the load register 144 forms the amplifier of the source follower. And being output to the floating diffusion layer 146 the signal charges are output as the voltage signal to the output terminal 145 from the amplifier of the source follower. Afterward, the signal charges are drained to the resetting drain 142 while placing reset gate electrode 141 in between. Here, owing to be output the signal charges as the voltage signal by the source follower, the power supply voltage VDD of the source follower is larger than the reset voltage (the power supply voltage VRD). In addition, COD is a device sequentially transferring electric charge (electrons) from higher potential side to lower potential side, so that potential in the regions under the individual transfer electrodes should always be lower than the resetting potential (power source voltage VRD). The signal charges are output as the output voltage from the source follower. Owing to keep high gain of the source follower, the power supply voltage VDD of the source follower is larger than the reset voltage (the power supply voltage VRD). Accordingly, in order to realize lower power consumption of CCD image sensor it is effective to lower the resetting potential (the power source voltage VRD) if the power supply voltage VDD of the source follower is lowered for lowering the power consumption. For this reason, for the purpose of ensuring a desirable level of transfer efficiency, or a desirable level of electric field intensity causing transfer, even when the power source voltage VRD is lowered aiming at low-voltage operation, it is inevitably necessary to concomitantly lower potential in the region under the individual transfer electrodes of the CCD register. This may be realized by lowering the NW concentration, if clock pulses to be applied to the individual transfer electrodes are left unchanged.

FIG. 15A and FIG. 15B are drawings for explaining potential at a section under the CCD storage electrodes in FIG. 13B (a section taken along line K-K'). The solid line represents potential attained under the CCD storage electrodes, and the broken line represents potential attained under the CCD barrier electrodes. Electric charge is accumulated in the portion (hatched area) between the potential attained under the storage electrodes and the deepest potential attained under the barrier electrodes. As shown in FIG. 15A, potential under the barrier electrodes is set so as to prevent the electric charge (electrons) accumulated under the storage electrodes from being brought into contact with the surface of the silicon substrate. This state is referred to as "barrier limit", and the maximum charge storage capacity in this state is referred to as "maximum charge storage capacity under barrier limit".

As shown in FIG. 15B, when potential barrier $\Delta\phi h\_st1$, equivalent to potential difference between the deepest portion of channel under the CCD storage electrodes and surface potential, is smaller than potential difference $\Delta\phi ba2$ between the deepest potential under the storage electrodes and the deepest potential under the barrier electrodes, the accumulated electric charge reaches the interface between the N-type well and the oxide film. This state is referred to as "surface limit", and the maximum charge storage capacity in this state is referred to as "maximum charge storage capacity under surface limit". In the surface limit state, electric charge is trapped at the interface between the N-type well and the oxide film in the process of charge transfer, so-called surface interference may occur, and this results in transfer failure. Therefore, in CCD registers, it is generally necessary to adjust the potential in the region under the barrier electrodes so as to establish the state of barrier limit.

FIG. 17A is a drawing showing NW concentration dependence of the potential under the storage electrodes. FIG. 17B is a drawing showing NW concentration dependence of the charge storage capacity. Lowering in the NW concentration makes the channel potential $\phi$nw lower (shallower), and makes position of the channel closer to the surface side, thereby potential barrier $\Delta\phi$ph is lowered, and the surface limit becomes more likely to be achieved. As a consequence, the maximum charge storage capacity of CCD reduces as the NW concentration lowers.

FIG. 16A is a drawing showing dependence of potential under the storage electrodes on electrode potential (Vg). FIG. 16B is a drawing showing Vg dependence of accumulated charge. Higher Vg raises (deepens) the channel potential $\phi$nw, and makes position of the channel closer to the surface side, so that the potential barrier $\Delta\phi$h is lowered, making the surface limit more likely to be achieved. As a consequence, the maximum charge storage capacity of CCD decreases as the Vg elevates.

Accordingly, lower NW concentration makes the surface interference more likely to occur even when the clock voltage in the process of transfer is left unchanged, so that potential under the barrier electrodes need be adjusted to a deeper level, but this consequently reduces the maximum charge storage capacity of CCD.

SUMMARY

In one feature of the present invention, there is provided a charge transfer device comprising; a P-type region, an N-type well provided therein, and transfer electrodes provided over the N-type well while placing an insulating film in between. Each of the transfer electrodes has a storage electrode and a barrier electrode. The storage electrode has a P-type polysilicon that is formed on the insulating film.

In this charge transfer device, the storage electrode has P-type conductivity. By virtue of this configuration, channel potential may be lowered (shallower), and thereby power source voltage may be lowered.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 2 is a plan view of the CCD image sensor according to a first embodiment of the present invention;

FIG. 7 is a plan view showing a COD image sensor according to a second embodiment of the present invention;

FIGS. 9A and 9B are a timing chart of drive pulses and a potential diagram, respectively, of the COD image sensor according to the second embodiment;

FIGS. 14A and 14B are a timing chart of drive pulses and a potential diagram, respectively, of the CCD image sensor 101 shown in FIG. 11;

DETAILED DESCRIPTION

Figure 1:
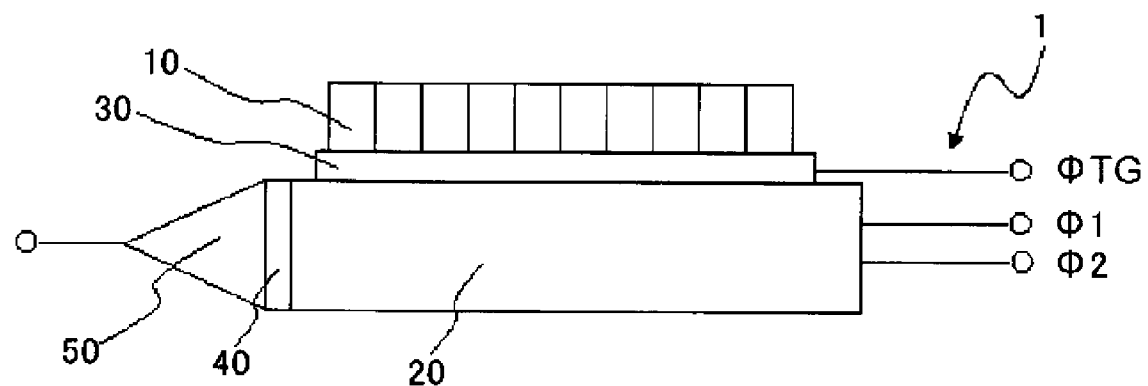
FIG. 1 is a schematic drawing of a COD image sensor according to a first embodiment of the present invention.

The invention will now be described herein with reference to illustrative embodiments. Those skilled in the art will recognize that many alternative embodiments can be accomplished using the teachings of the present invention and that the invention is not limited to the embodiment illustrated for explanatory purposes.

Paragraphs below will detail preferred embodiments of the present invention, referring to the attached drawings. Any identical constituents will be given with the same reference numerals, and explanations therefor will not be repeated.

First Embodiment

FIG. 1 is a schematic drawing of a CCD image sensor (charge transfer device) according to a first embodiment of the present invention. A CCD image sensor 1 has photodiodes 10, a CCD register 20, and a transfer gate electrode 30. On one end of the CCD register 20, there are provided a charge detecting unit 40 and an output circuit 50. The transfer gate electrode 30 is provided between the photodiodes 10 and the CCD register 20.

FIG. 2 is a plan view of a CCD image sensor 1. The photodiodes 10 are isolated from each other by a device isolation region 14 formed of a $P^+$-type diffusion layer, for example. The CCD register 20 contains four types of electrodes 21 to 24. The electrodes 21 are $\Phi$1 storage electrodes. The electrodes 22 are $\Phi$1 barrier electrodes. The electrodes 23 are $\Phi$2 storage electrodes. The electrodes 24 are $\Phi$2 barrier electrodes. These electrodes 21 to 24 are repetitively arranged in this order. The electrodes 21 to 24 are connected via contacts 25 to metal interconnects 26, 27, and are supplied with drive pulses $\Phi$1 or $\Phi$2, respectively. Assuming now pitch of unit cell in the direction of electron transfer as L, the configuration herein is such as making four electrodes 21 to 24 corresponded to L.

Figure 3A:
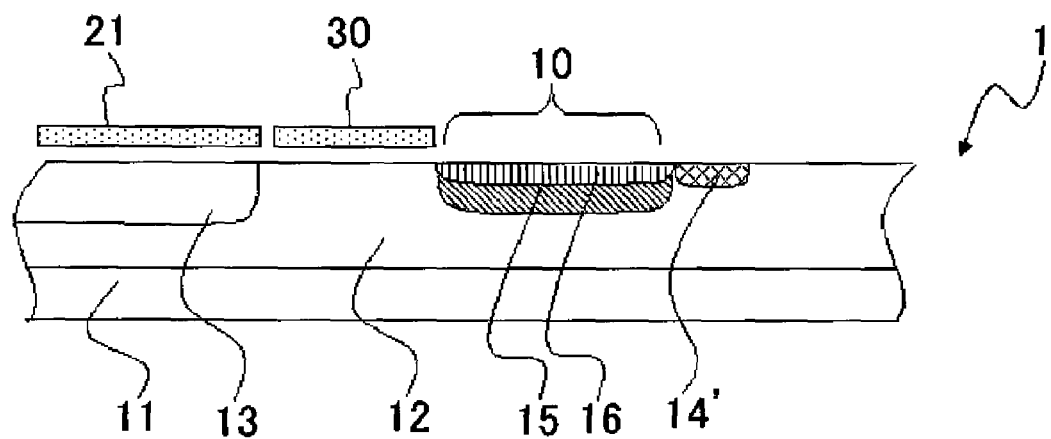
FIGS. 3A and 3B are sectional views taken along line A-A' and line B-B' in FIG. 2, respectively.
Figure 3B:
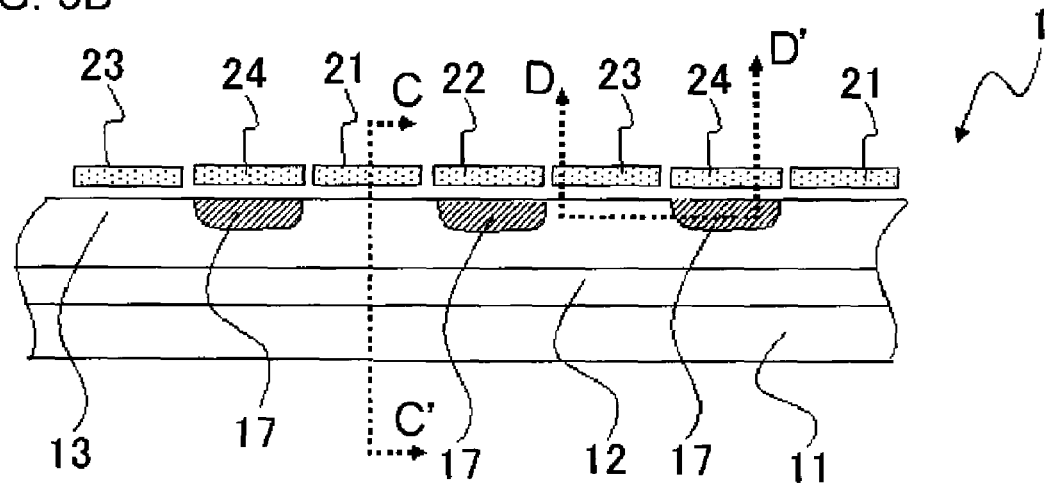

FIG. 3A and FIG. 3B are sectional views respectively taken along line A-A' and line B-B' in FIG. 2. The CCD image sensor 1 has an N-type substrate 11 (semiconductor substrate), an N-type well 13 provided to the surficial portion of the N-type substrate 11, and transfer electrodes provided to the N-type substrate 11 while placing an insulating film (not shown) in between, having P-type conductivity.

For more details, in the surficial portion of the N-type substrate 11, there is a P-type well 12 (P-type region) formed therein, and there is an N-type well 13 formed further in the surficial portion thereof. In the surficial portion of the P-type well 12, there are formed also a P$^+$-type diffusion layer 14' forming the device isolation region, an N-type diffusion layer 15 and a P$^+$-type diffusion layer 16 forming the photodiodes 10, and an N$^-$-type diffusion layer 17. The N$^-$-type diffusion layers 17 are opposed to the electrodes 22, 24.

The transfer electrodes of the CCD image sensor 1 are formed of dual-phase electrodes containing storage electrodes (electrode 21, 23) and barrier electrodes (electrodes 22, 24). The electrodes 21, 23 are the storage electrodes of P-type polysilicon.

Figure 4A:
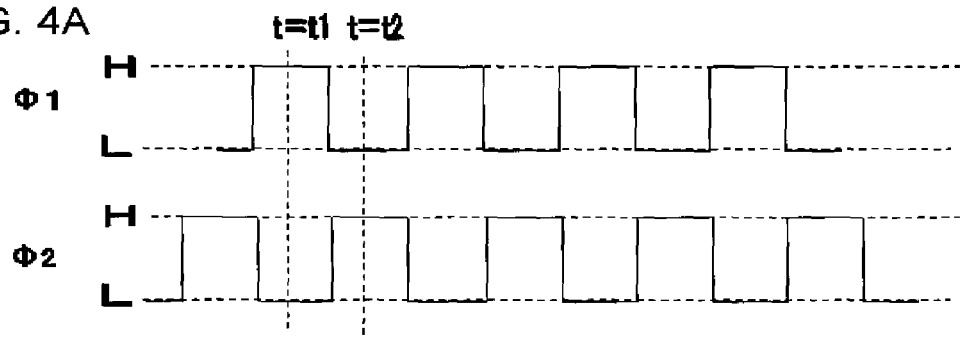
FIGS. 4A and 4B are a timing chart of drive pulses and a potential diagram, respectively, of the CCD image sensor according to the first embodiment.
Figure 4B:
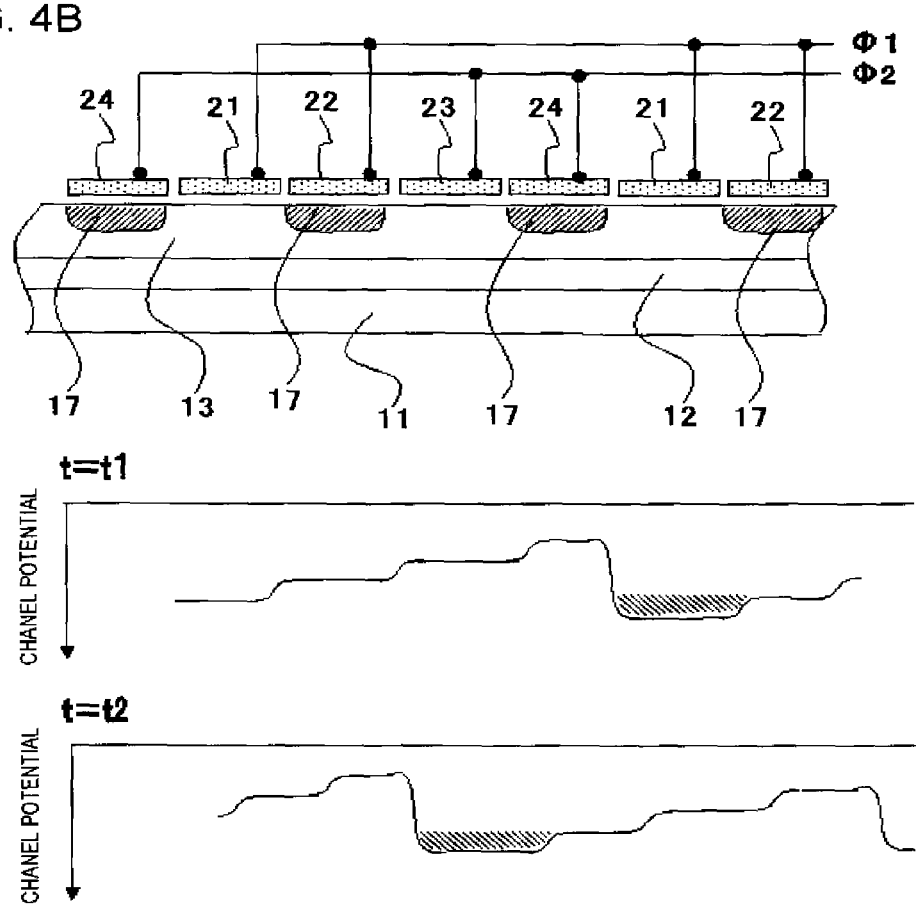

FIG. 4A and FIG. 4B are timing chart of drive pulses and a potential diagram, respectively, of the CCD image sensor 1. By applying drive pulses Φ1 and Φ2, differed in the phase by 180° from each other, respectively to terminals Φ1, Φ2, potential at the portions under the individual electrodes varies, and electrons are serially transferred leftward in the drawing.

Thinking process of this embodiment will be explained. In the CCD image sensor 1, the transfer electrodes have P-type conductivity. The configuration makes surface interference of signal charges less likely to occur, and thereby the maximum charge storage capacity of the CCD image sensor 1 may be increased. Also the high-level potential of the CCD transfer clock, capable of preventing the surface interference, may be elevated.

Figure 5A:
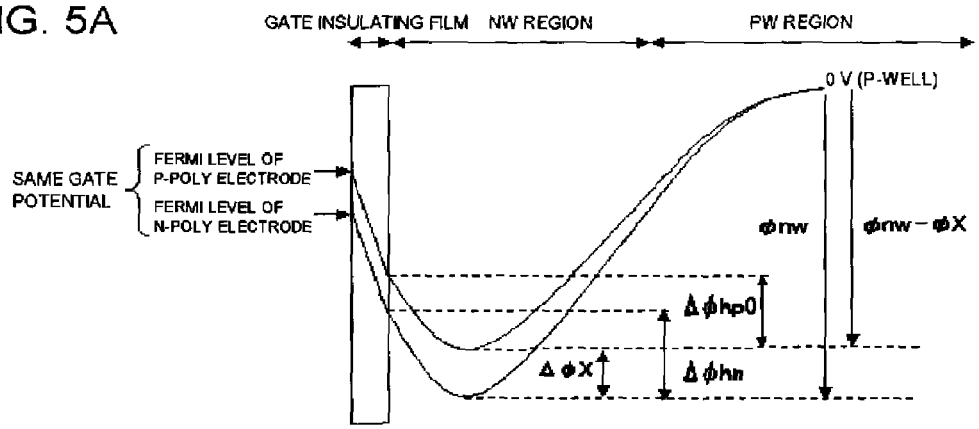
FIGS. 5A to 5C are drawings explaining effects of the first embodiment.

FIG. 5A to FIG. 5C and FIG. 6A are potential diagrams of the region under the CCD storage electrodes as seen in the C-C' section of FIG. 3B. FIG. 5A is a potential diagram obtained when the same potential was applied to the N-type polysilicon electrode and to the P-type polysilicon electrode. Difference in the channel potential of as large as $\Delta\phi X$ is observed by the contribution of difference between the work functions of P-type polysilicon and N-type polysilicon (approximately 1.1 V). The maximum charge storage capacity of N-type polysilicon electrodes of CCD is corresponded to the potential barrier $\Delta\phi hn$ and the maximum charge storage capacity of the P-type polysilicon electrodes of CCD is corresponded to potential barrier $\Delta\phi hp0$. However, the maximum charge storage capacity of CCD shrinks only interchanging the N-type polysilicon electrodes of CCD to the P-type polysilicon electrodes of CCD because of $\Delta\phi hn > \Delta\phi hp0$.

Figure 5B:
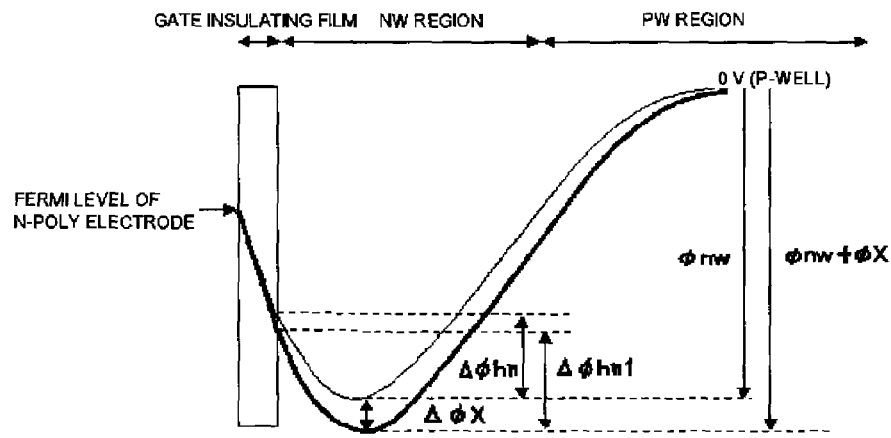
Figure 5C:
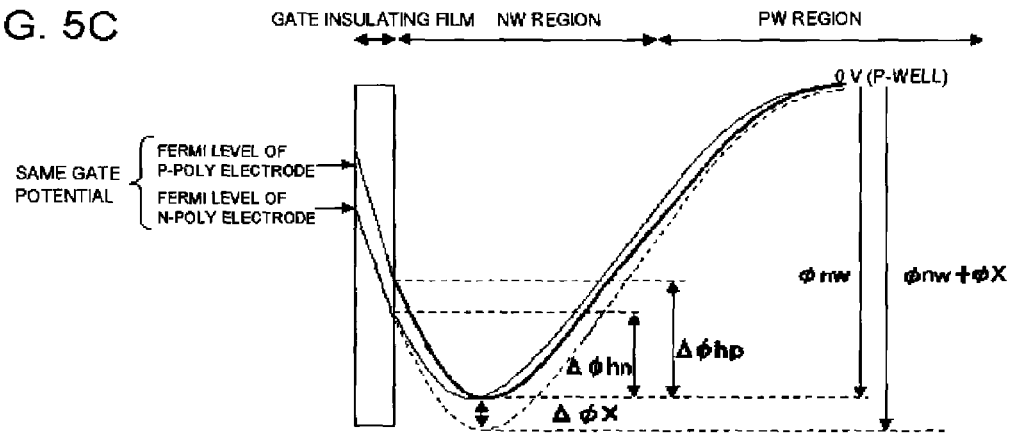

The thick line in FIG. 5B represents a potential curve observed when the NW concentration was increased by an increment of as large as the difference $\Delta\phi X$ in work function, for the case of using an N-type polysilicon electrode. The channel potential is given as $\phi nw + \phi X$, potential barrier $\Delta\phi hn1$ satisfies the relation $\Delta\phi hn1 > \Delta\phi hn$, and the maximum charge storage capacity of CCD increases.

The thick line in FIG. 5O represents a potential curve observed when the electrode was exchanged to a P-type polysilicon electrode, while leaving the NW concentration unchanged at $\phi nw + \phi X$ attained for the case where the N-type polysilicon electrode was used. The channel potential under the P-type polysilicon electrode now becomes $\phi nw$, after being shifted to as much as difference $\Delta\phi X$ in work function.

Figure 6A:
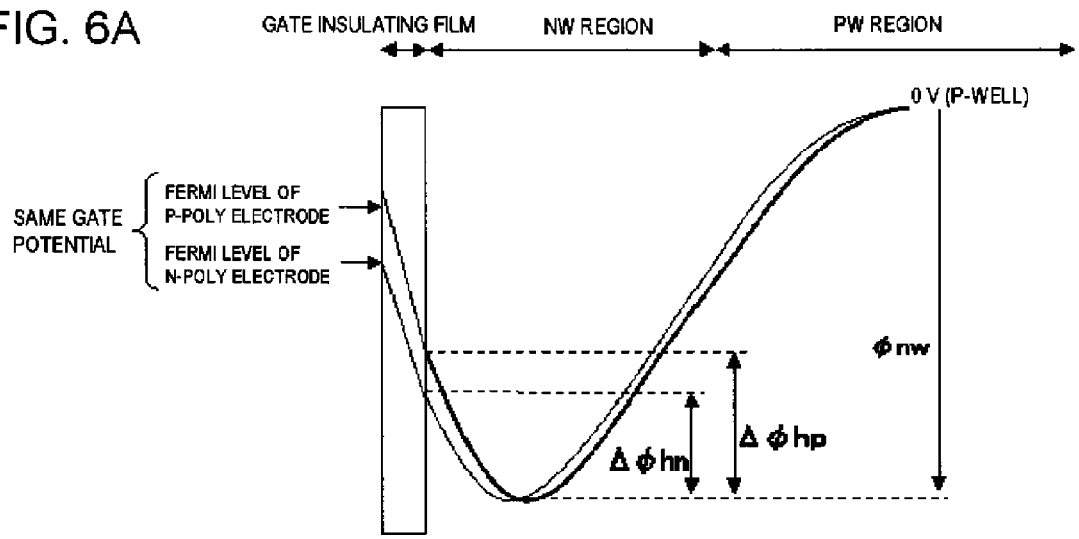
FIGS. 6A and 6B are drawings explaining effects of the first embodiment.

FIG. 6A is a potential diagram showing cases where the NW concentration was adjusted so as to give a channel potential of $\phi nw$ for both cases of using the N-type polysilicon electrode and the P-type polysilicon electrode. In other words, FIG. 6A is a combined graph of the potential curve for the case of using the N-type polysilicon electrode shown in FIG. 5A, and the thick line shown in FIG. 5C. As may be understood from the drawing, the relation $\Delta\phi hp > \Delta\phi hn$ always holds under the same channel potential $\phi nw$, so that the maximum charge storage capacity increases.

Figure 19:
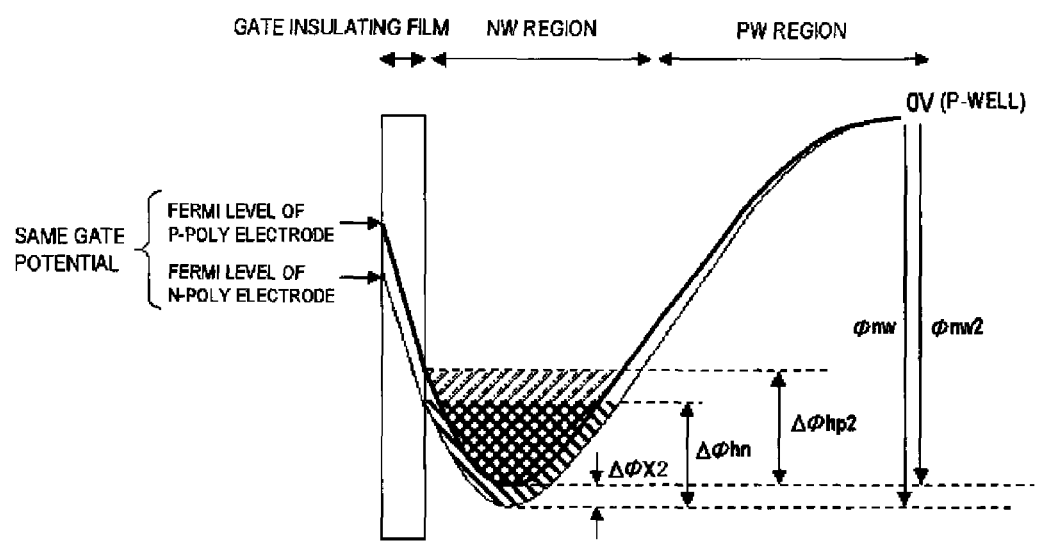
FIG. 19 is a drawing explaining effects of the first embodiment.

Next, in FIG. 19 the bold line shows the potential distribution curve of P-type polysilicon electrodes when the NW concentration is decreased to the concentration which the maximum charge storage capacity of the N-type polysilicon electrodes of CCD comes up initial one, namely the potential distribution curve of the N-type polysilicon electrodes of CCD in FIG. 5A. In FIG. 19 the slimline is the initial one, namely the potential distribution curve of the N-type polysilicon electrodes of CCD in FIG. 5A. Then, if the potential distribution curve of P-type polysilicon electrodes is $\phi nw2$, the initial channel potential of the N-type polysilicon electrodes of CCD is $\phi nw$. Accordingly, the relation between the channel potential of the N-type polysilicon electrodes of CCD and the potential distribution curve of P-type polysilicon electrodes of CCD is $\phi nw2 < \phi nw$. Actually, when the NW concentration is controlled as same the maximum charge storage capacity of the P-type polysilicon electrodes of CCD as the maximum charge storage capacity of the N-type polysilicon electrodes of CCD in the same gate voltage Vg, the relation between the channel potential of the N-type polysilicon electrodes of CCD and the potential distribution curve of P-type polysilicon electrodes of CCD is $\phi nw2 < \phi nw$. Actually, the maximum charge storage capacity of the P-type polysilicon electrodes of CCD may set the reset voltage (power supply voltage VRD) so lower as channel potential. Consequentially, the amplifier of the source follower may set the power supply voltage VDD low, and the electric power consumption of CCD image sensor may be cut down.

By the way, when the electric power consumption of CCD image sensor is as same as original, the channel potential of P-type polysilicon electrode is Φnw. The potential barrier $\Delta\phi hp$ of P-type polysilicon electrode is higher than the potential barrier $\Delta\phi hn$ of N-type polysilicon electrode in FIG. 6A, so that the maximum charge storage capacity of P-type polysilicon electrode of CCD is higher than that of N-type polysilicon. Accordingly increasing the signal output, higher S/N ratio may be obtained. If the channel potential of P-type polysilicon electrode is set between Φnw2 and Φnw, the electric power consumption of CCD image sensor may be decreased and S/N ratio may be upgraded.

Figure 6B:
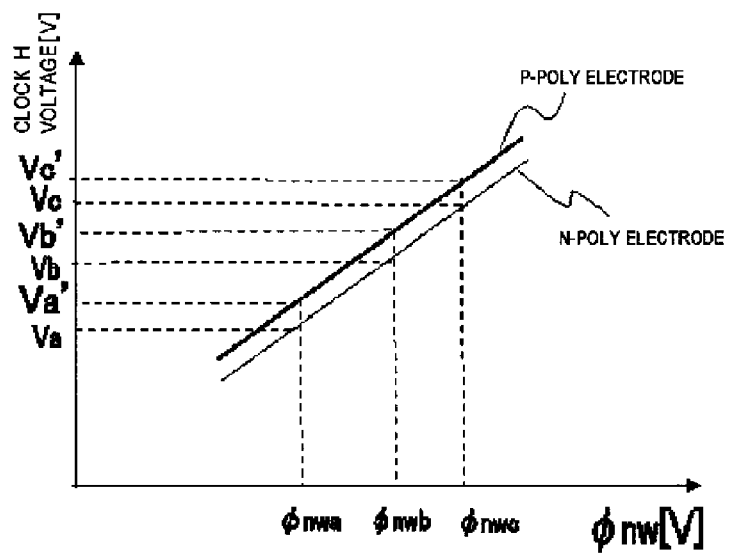

And the gate voltage of P-type polysilicon electrode which the surface interference occurs is work function difference (1.1V) higher than that of N-type poly silicon electrode. In other words, as shown in FIG. 6B, the P-type polysilicon electrode can elevate the high level voltage of the CCD transfer clock capable of preventing the surface interference under the same channel potential, as compared with the N-type polysilicon electrode. Accordingly, the margin of high level potential of the CCD transfer clock which the surface interference occurs may be wider and the design possibility of CCD may be expanded.

Figure 15A:
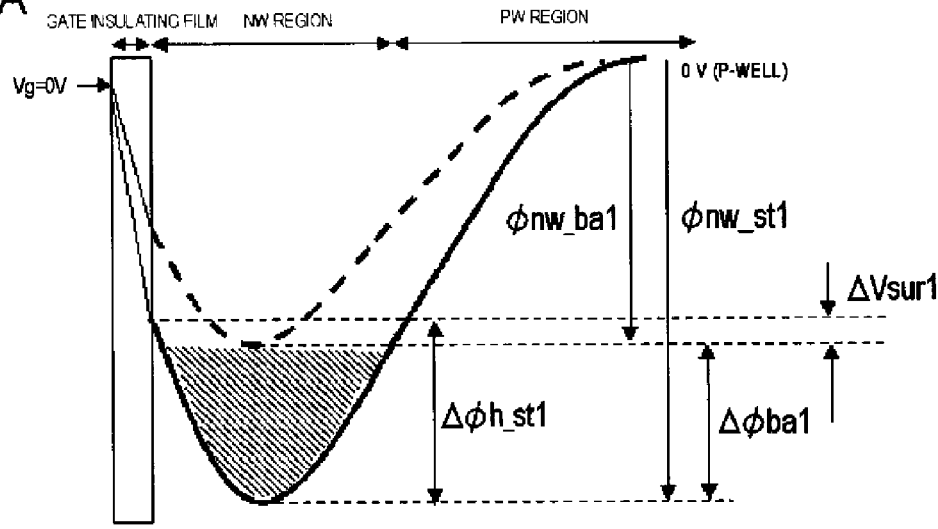
FIGS. 15A and 15B are drawings explaining potential at a section taken along line K-K' in FIG. 13B.
Figure 15B:
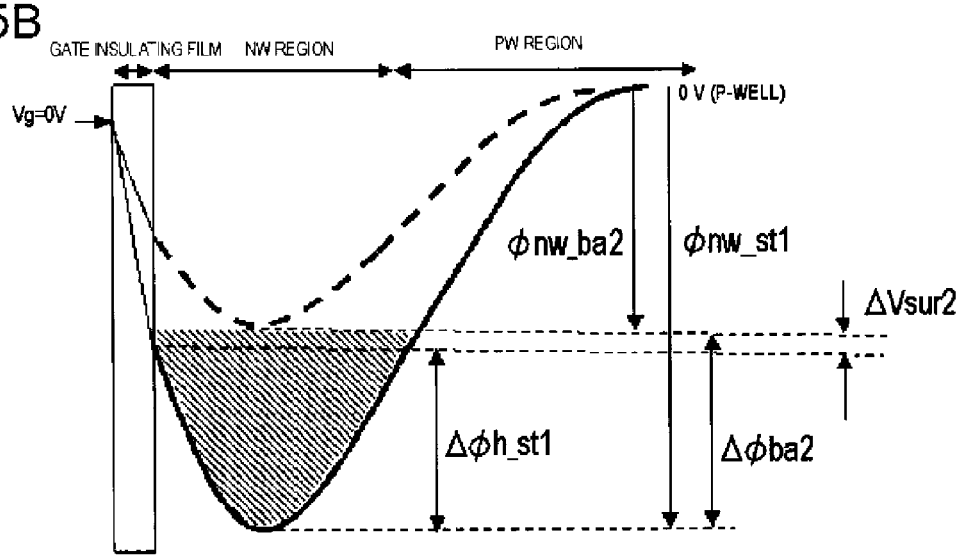
Figure 16A:
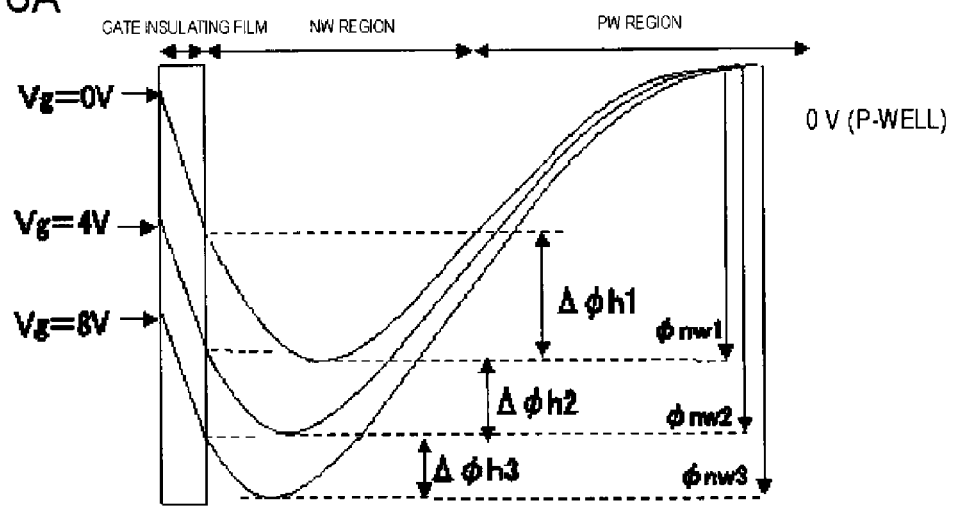
FIGS. 16A and 16B are a drawing showing dependence of potential under the storage electrodes on electrode potential (Vg) and a drawing showing Vg dependence of accumulated charge respectively.
Figure 16B:
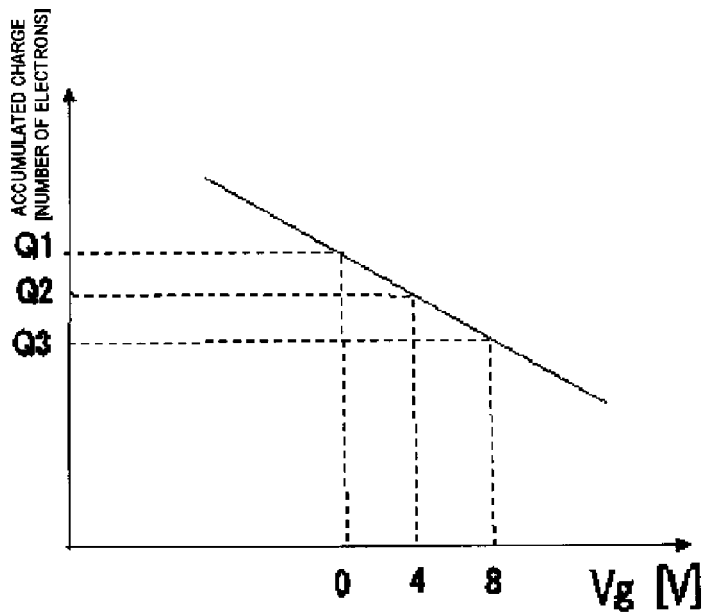
Figure 17A:
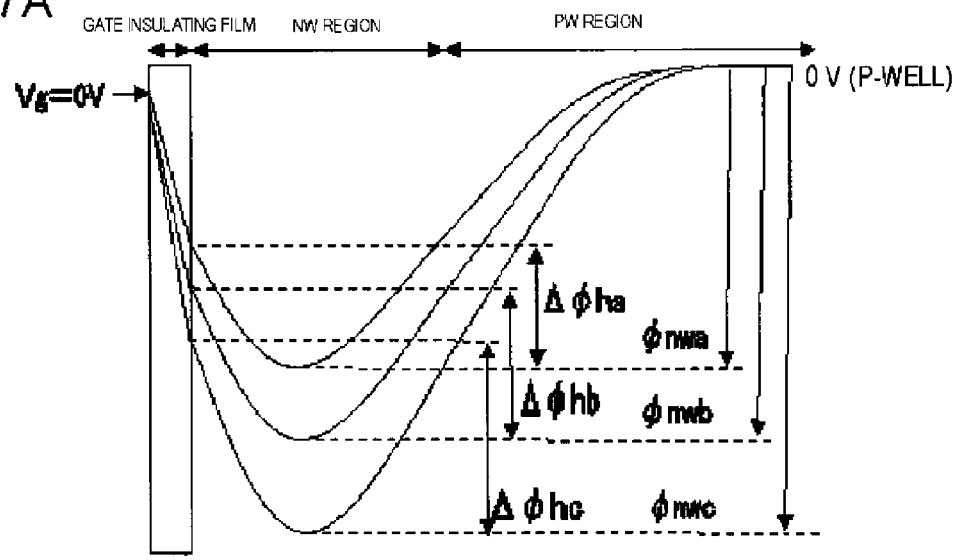
FIGS. 17A and 17B are a drawing showing NW concentration dependence of the potential under the storage electrode and a drawing showing NW concentration dependence of the charge capacity respectively.
Figure 17B:
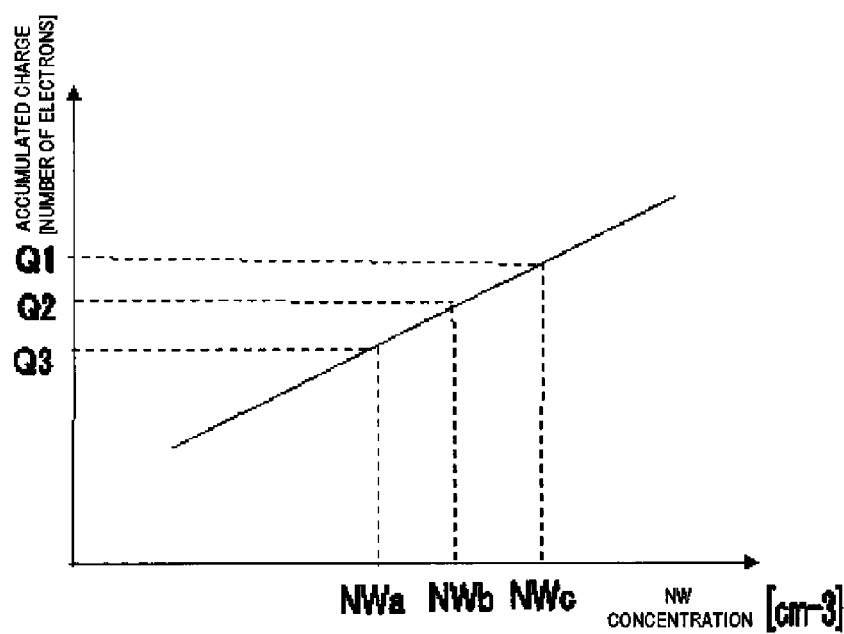
Figure 18A:
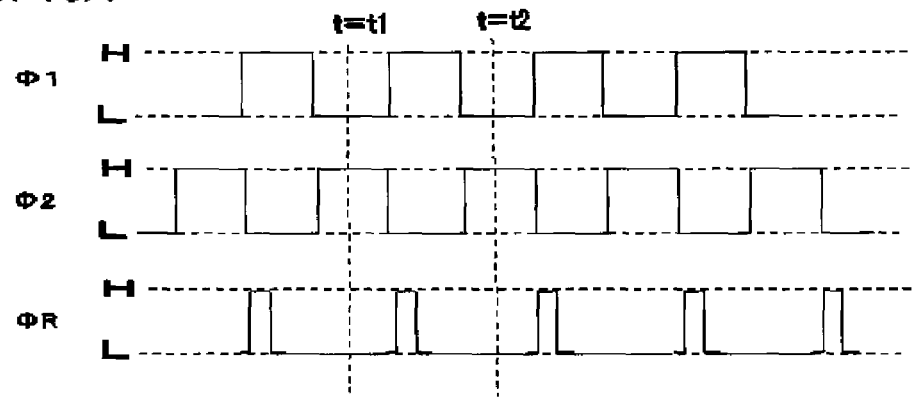
FIGS. 18 and 18B are a timing chart of drive pulses and a potential diagram, respectively, of the CCD image sensor 101 shown in FIG. 12.
Figure 18B:
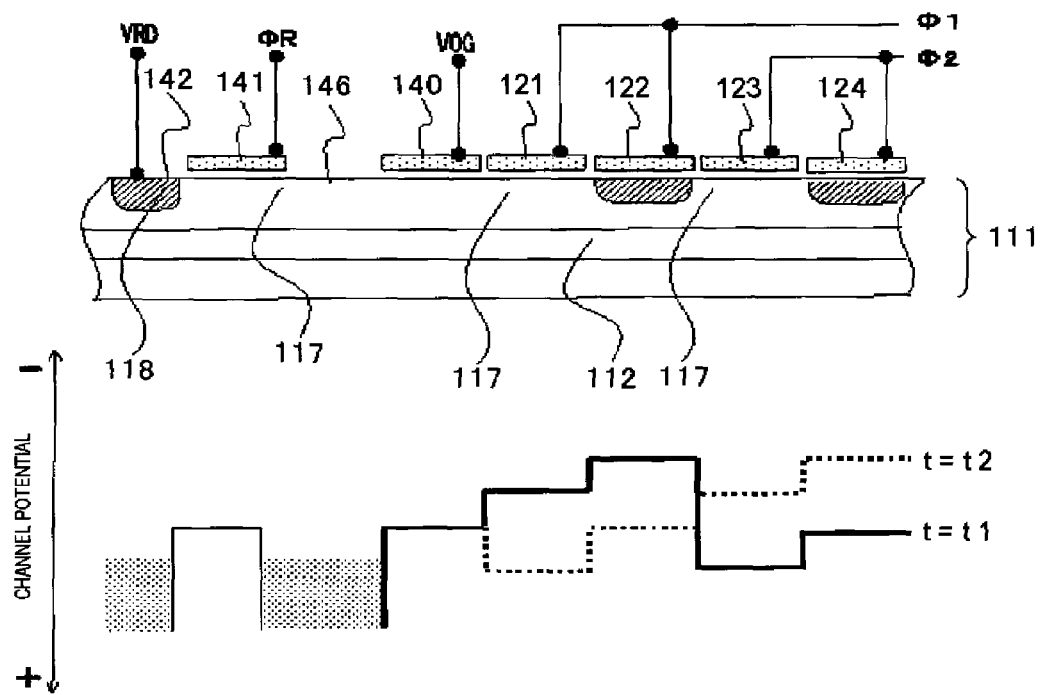

Here, the barrier electrode 22, 24 may be formed of either P-type polysilicon or N-type polysilicon. After all is said, the potential of that under barrier electrode may be set the barrier limit as broken line in FIG. 15A. Therefor it may control the impurity concentration of N$^-$-type diffusion layer 117. The P-type polysilicon electrode in FIG. 19 has the maximum charge storage capacity of P-type polysilicon electrodes of CCD as well as that of N-type polysilicon electrode of CCD, so the S/N ratio of P-type polysilicon electrode equates with that of N-type polysilicon electrode. When the channel potential of P-type polysilicon electrode is approached to the channel potential of N-type polysilicon electrode Φnw, potential under the barrier electrodes achieving the barrier limit may be set relatively lower (shallower) than in the COD image sensor 101, by adopting P-type polysilicon to the transfer electrodes of the CCD register, so that the maximum charge storage capacity of COD may be increased. By virtue of increase in the signal output, higher S/N ratio may be obtained.

By the way, Japanese Laid-Open Patent Publication No. 2004-22624 discloses a CMOS image sensor having a buried transfer transistor by which electrons are transferred from PD to FD. In contrast, the charge transfer device of this embodiment has a charge coupled device provided with the transfer electrodes, wherein P-type conductive polysilicon is used for the transfer electrodes.

Japanese Laid-Open Patent Publication No. 2001-196572 discloses a technique of making the channel potential shallower and thereby suppressing dark current, by adopting a semiconductor substrate having P-type conductivity (charge accumulation type) and P-type polysilicon electrodes. TR structure of the channel portion is of the surface channel type. In contrast, in the charge transfer device of this embodiment, the NW potential structure is of the buried channel type.

Japanese Laid-Open Patent Publication Nos. 2005-209879 and 2001-308313 discloses a technique of configuring first electrodes, which serve as the transfer electrodes, using N-type polysilicon. As has been described in the above, the conventional transfer electrodes generally had N-type conductivity. In contrast, in the charge transfer device of this embodiment, the first electrodes (electrodes 21, 23) are formed of P-type polysilicon.

Second Embodiment

Figure 8A:
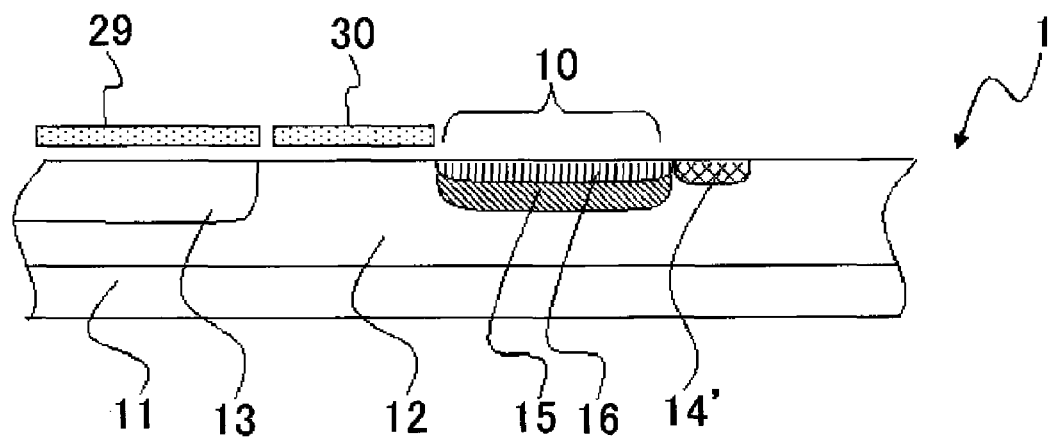
FIGS. 8A and 8B are sectional views respectively taken along line E-E' and line F-F' in FIG. 7.
Figure 8B:
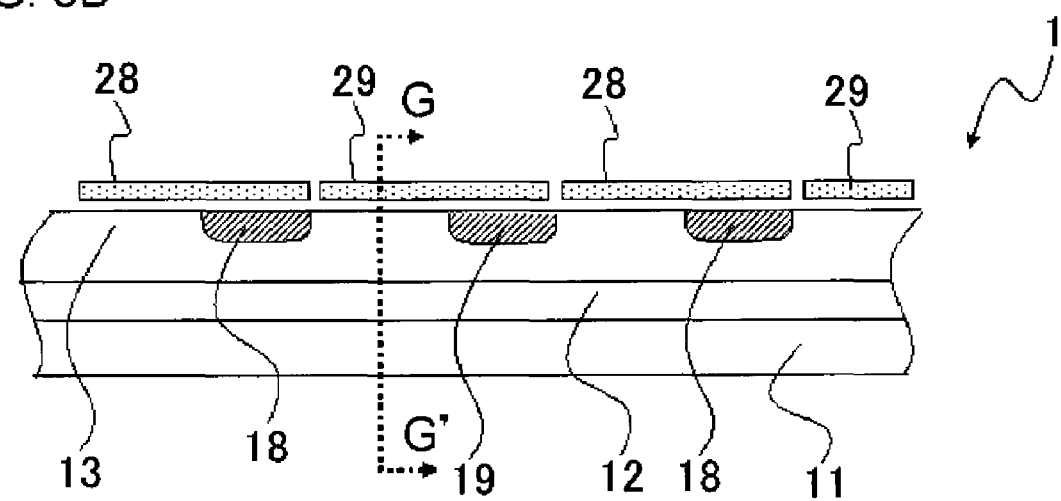
Figure 10:
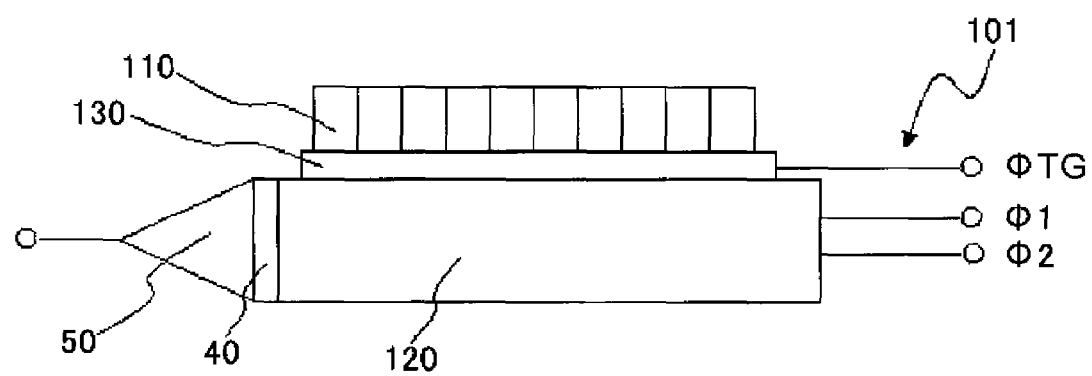
FIG. 10 is a schematic drawing of a linear CCD image sensor 101.
Figure 11:
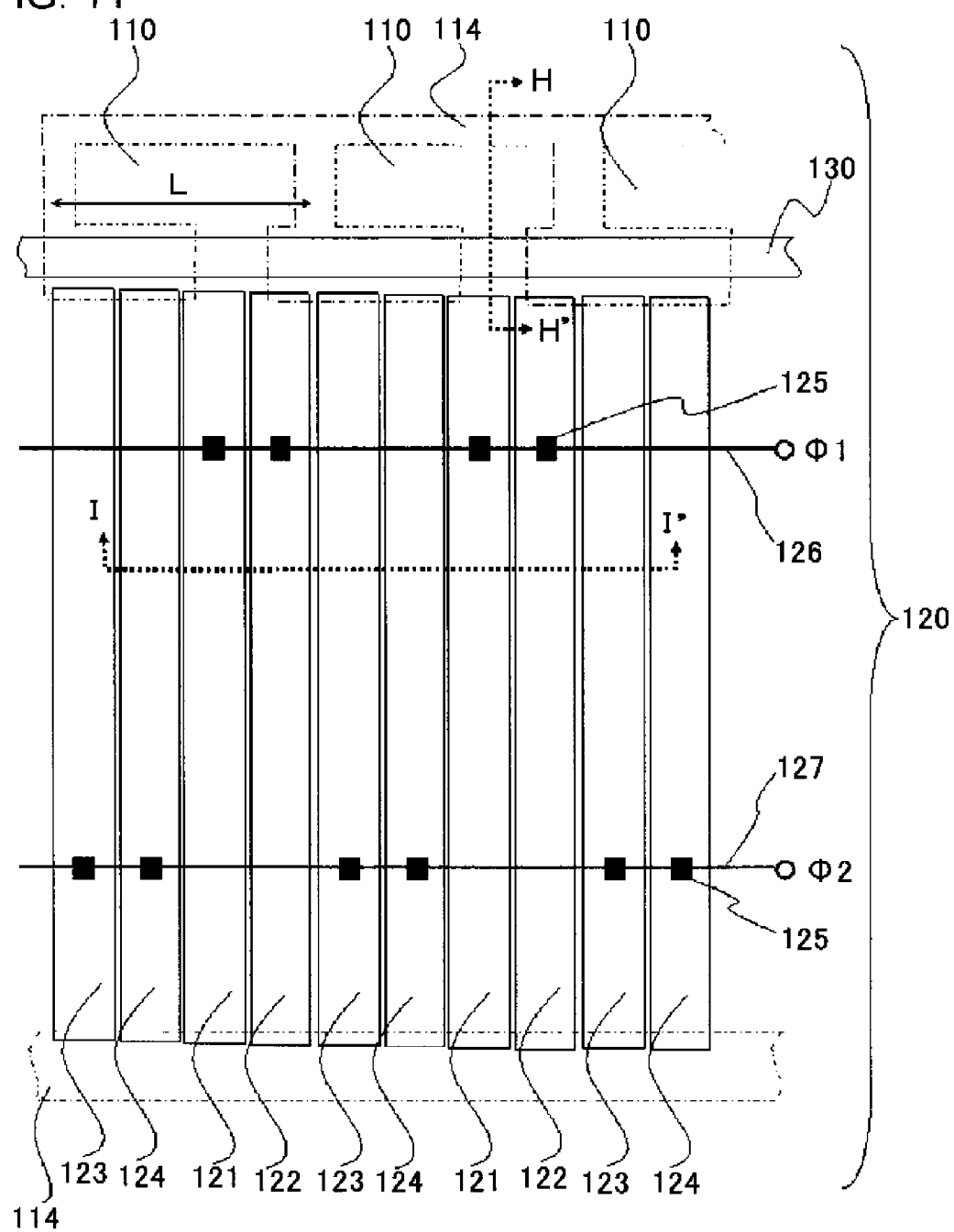
FIG. 11 is a plan view showing a CCD image sensor 101.
Figure 12:
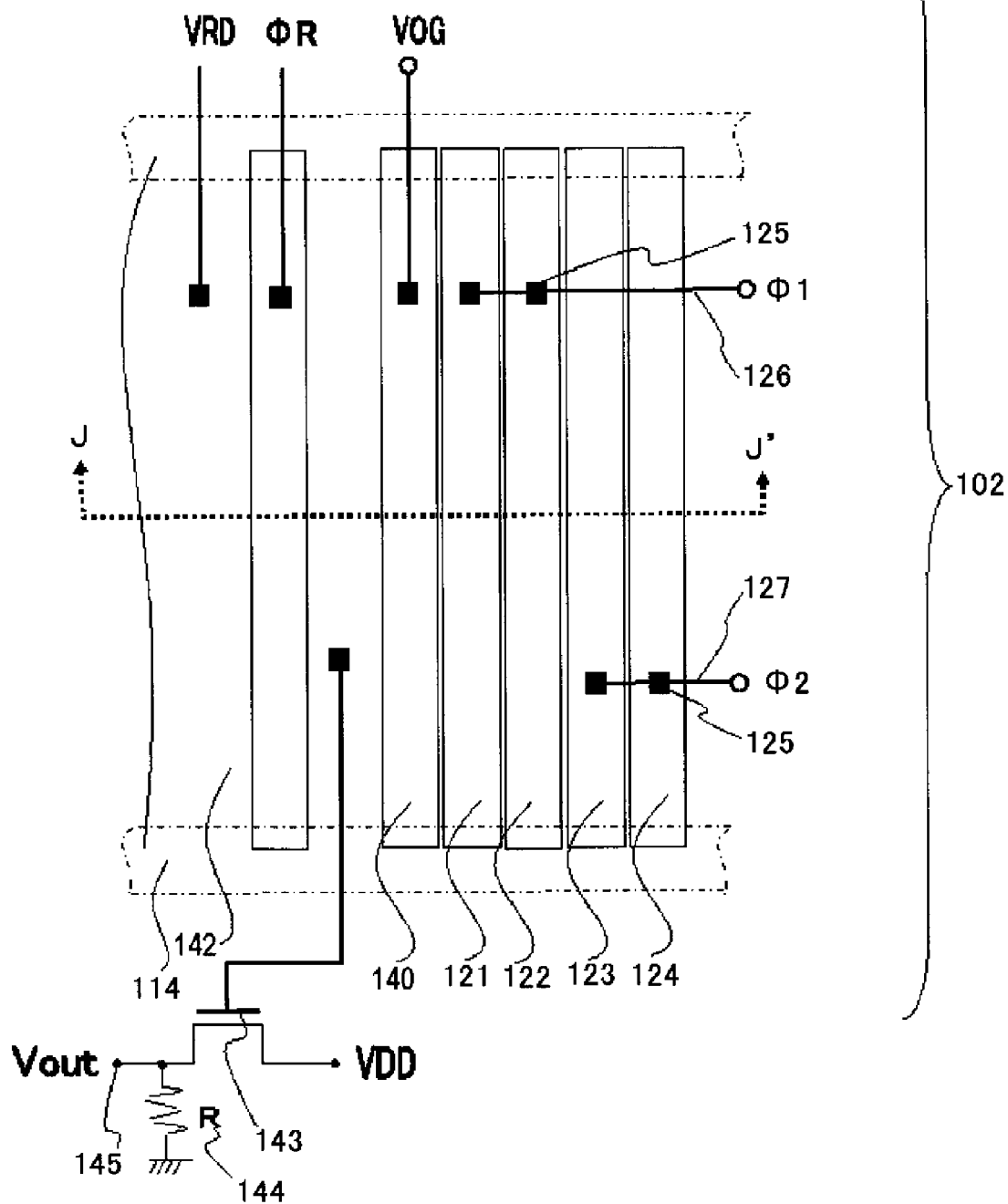
FIG. 12 is a plan view showing an output section of the CCD image sensor 101.
Figure 13A:
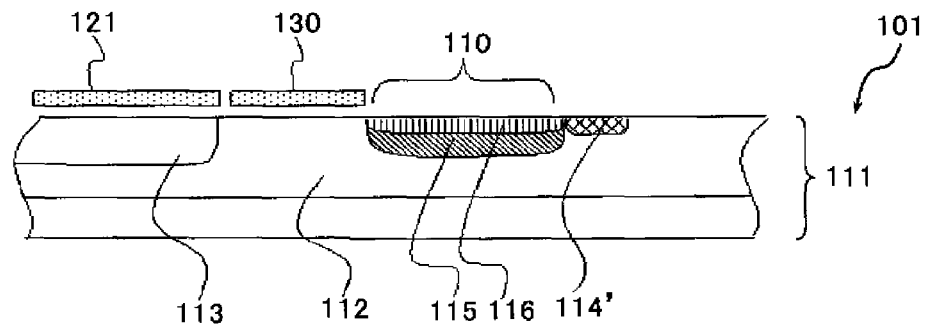
FIGS. 13A and 13B are sectional views respectively taken along line H-H' and line I-I' in FIG. 11.
Figure 13B:
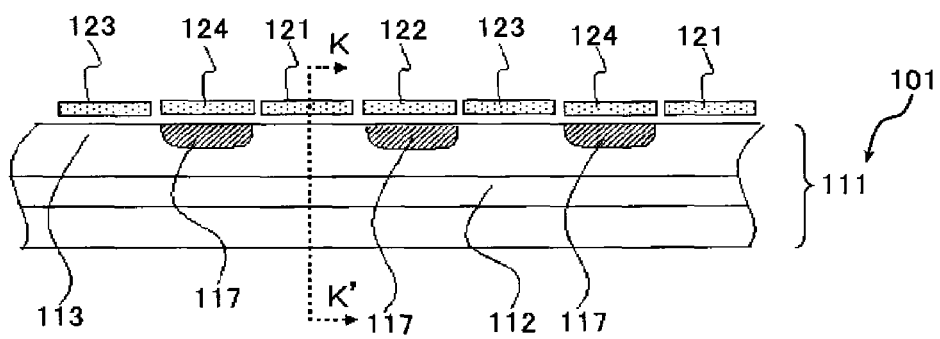
Figure 13C:
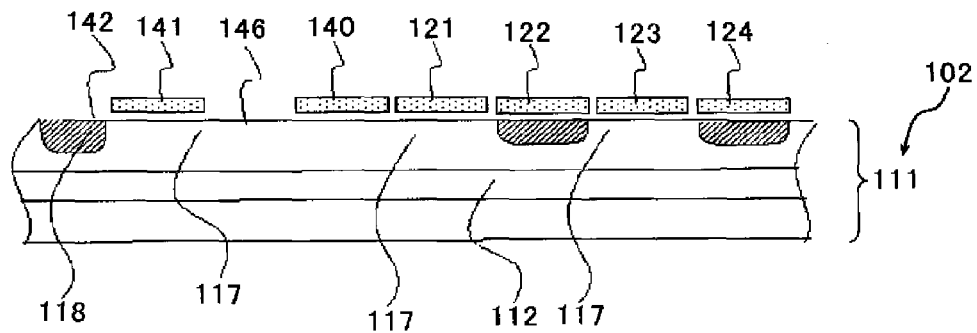
FIG. 13C is a sectional view taken along line J-J'' in FIG. 12.

FIG. 7 is a plan view of a CCD image sensor according to a second embodiment of the present invention. FIG. 8A and FIG. 8B are sectional views respectively taken along E-E' and line F-F' in FIG. 7.

As shown in FIG. 7, two types of electrodes are arranged in the CCD register. Electrodes 29 are Φ1 electrodes formed of P-type polysilicon. Barrier regions 19 are N⁻-type diffusion layers formed by ion implantation into the N well under the electrodes 29. Electrodes 28 are Φ2 electrodes formed of P-type polysilicon. Barrier regions 18 are N⁻-type diffusion layers formed by ion implantation into the N well under the electrodes 28. The electrodes 29, 28 are connected via contacts 25 to metal interconnects 26, 27, respectively, and are supplied with drive pulse Φ1 or Φ2. Assuming now pitch of unit cell in the direction of electron transfer as L, the configuration herein is such as making two electrodes 29 and 28 corresponded to L.

FIGS. 9A and 9B are a timing chart of drive pulses and a potential diagram, respectively, of the CCD image sensor according to this embodiment. By applying the drive pulses Φ1 and Φ2, differed in the phase by 180° from each other, respectively to terminals Φ1, Φ2, potential at the portions under the individual electrodes varies, and electrons are serially transferred leftward in the drawing. Also in this configuration, relation of potentials between the storage region, which is a region of the N well under the electrodes 28, 29 and capable of accumulating charge, and the N⁻-type diffusion layer region which serves as the potential barrier is same as that shown in FIG. 6A, wherein relation Δϕhp>Δϕhn holds, and thereby the maximum charge storage capacity increases.

The present invention is by no means limited to the above-described embodiments, instead allowing various modifications. For example, the insulating film under the CCD is not limited to silicon oxide film, instead allowing use of silicon nitride film, ON film formed of a silicon nitride film and a silicon oxide film stacked with each other, and ONO film formed of a silicon nitride film sandwiched by silicon oxide films. It is also obvious that the effects of the present invention are ascribable to control of work function, and are irrespective of composition of the insulating substance placed therebetween. Incidentally, a P-type substrate (P-type region) may be used as a substitute for the N-type substrate and the P-type well.

The above-described embodiments exemplified polysilicon as a material forming the transfer electrodes. The material forming the transfer electrodes are, however, not limited to polysilicon, and may be arbitrary. For example, combination of P-type polysilicon and metal formed thereon (so-called "polycide" structure, for example), may be adoptable to the material forming the transfer electrodes. The metals adoptable herein may be tungsten, molybdenum or the like.

The above mentioned embodiments may preferably be adoptable to CCD image sensor characterized by charge transfer function. The CCD image sensor successfully acquires image information by allowing light receiving elements such as photodiodes to serially output signal charge accumulated depending on received energy of light. The CCD image sensor is widely adopted to facsimile, scanner, copying machine, digital camera, and so forth.

It is apparent that the present invention is not limited to the above embodiment, that may be modified and changed without departing from the scope and spirit of the invention.

The invention claimed is:

1. A method of making a charge transfer device which comprises a P-type region, an N-type well formed in the P-type region, and transfer electrodes provided over the N-type well while placing an insulating film in between, each of the transfer electrodes including a storage electrode and a barrier electrode, the storage electrode being provided as a P-type polysilicon that is formed on the insulating film, comprising:

examining a potential difference between a potential of the N-type well under the storage electrode being provided as an N-type polysilicon and a potential of the N-type well under the storage electrode being provided as a P-type polysilicon on condition that the N-type well has a first impurity concentration and the same potential is applied to the N-type polysilicon and the P-type polysilicon; and setting an impurity concentration of the N-type well to a second impurity concentration so that a potential of the N-type well having the second impurity concentration under the storage electrode being provided as the P-type polysilicon is substantially equal to the potential of the N-type well having the first concentration under the storage electrode being provided as the N-type polysilicon.

2. The method of making a charge transfer device as claimed in claim 1, wherein the storage electrode and the barrier electrode included in one transfer electrode are formed from a single polysilicon layer.

3. The method of making a charge transfer device as claimed in claim 1, wherein the storage electrode and the barrier electrode included in one transfer electrode are joined to each other.

4. The method of making a charge transfer device as claimed in claim 1, wherein the storage electrode further comprises a conductive material that includes metal formed on the P-type polysilicon.

5. The method of making a charge transfer device as claimed in claim 1, wherein the barrier electrode is provided as a P-type polysilicon.

6. The method of making a charge transfer device as claimed in claim 1, wherein the barrier electrode is provided as an N-type polysilicon.

7. The method of making a charge transfer device as claimed in claim 1, wherein the barrier electrode is provided as a polysilicon and a conductive material that includes metal formed thereon.

8. The method of making a charge transfer device as claimed in claim 1, further comprising:
    an N-type diffusion region formed in an upper portion in the N-type well which is provided under the barrier electrode, N-type diffusion region having
    a third impurity concentration lower than the second impurity concentration.

* * * * *